(12) United States Patent
Matsuda et al.

(10) Patent No.: US 8,884,498 B2
(45) Date of Patent: Nov. 11, 2014

(54) PIEZOELECTRIC MATERIAL, PIEZOELECTRIC ELEMENT, LIQUID DISCHARGE HEAD, ULTRASONIC MOTOR, AND DUST CLEANING DEVICE

(75) Inventors: Takanori Matsuda, Chofu (JP); Takayuki Watanabe, Yokohama (JP); Jumpei Hayashi, Chofu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/702,997

(22) PCT Filed: Jun. 7, 2011

(86) PCT No.: PCT/JP2011/063621
§ 371 (c)(1),
(2), (4) Date: Dec. 7, 2012

(87) PCT Pub. No.: WO2011/155632
PCT Pub. Date: Dec. 15, 2011

(65) Prior Publication Data
US 2013/0076204 A1    Mar. 28, 2013

(30) Foreign Application Priority Data

Jun. 10, 2010  (JP) .................................. 2010-133292
May 24, 2011  (JP) .................................. 2011-115838

(51) Int. Cl.
*H01L 41/187*    (2006.01)
*H02N 2/10*    (2006.01)
(Continued)

(52) U.S. Cl.
CPC ....... *H01L 41/1871* (2013.01); *C04B 2235/444* (2013.01); *C04B 2235/3262* (2013.01);
(Continued)

(58) Field of Classification Search
USPC .......................... 310/358, 358.311, 357, 365; 252/62.9 R, 62.9 PZ; 501/134, 135
See application file for complete search history.

(56) References Cited

U.S. PATENT DOCUMENTS 5,684,612 A    11/1997  Wilde
2007/0120164 A1    5/2007  Fukui
(Continued)

FOREIGN PATENT DOCUMENTS

CN    1812128 A    8/2006
CN    101575213 A    11/2009
(Continued)

OTHER PUBLICATIONS

U.S. Appl. No. 13/702,996, filed Dec. 7, 2012, Jumpei Hayashi.
(Continued)

*Primary Examiner* — Thomas Dougherty
*Assistant Examiner* — Karen B Addison
(74) *Attorney, Agent, or Firm* — Canon U.S.A., Inc. IP Division (57) ABSTRACT

A piezoelectric material containing a barium bismuth calcium niobate-based tungsten bronze structure metal oxide having a high degree of orientation is provided. A piezoelectric element, a liquid discharge head, an ultrasonic motor, and a dust cleaning device including the piezoelectric material are also provided. The piezoelectric material includes a tungsten bronze structure metal oxide that includes metal elements which are barium, bismuth, calcium, and niobium; and tungsten. The metal elements satisfy following conditions on a molar basis: when Ba/Nb=a, $0.37 \leq a \leq 0.40$, when Bi/Nb=b, $0.020 \leq b \leq 0.065$, and when Ca/Nb=c, $0.007 \leq c \leq 0.10$. The tungsten content on a metal basis is 0.4 to 2.0 parts by weight relative to 100 parts by weight of the tungsten bronze structure metal oxide. The tungsten bronze structure metal oxide has a c-axis orientation.

8 Claims, 5 Drawing Sheets

(51) Int. Cl.
*B08B 7/02* (2006.01)
*H01L 41/43* (2013.01)
*B41J 2/14* (2006.01)
*H02N 2/16* (2006.01)
*C04B 35/495* (2006.01)

(52) U.S. Cl.
CPC ..... *C04B 2235/76* (2013.01); *C04B 2235/3208* (2013.01); *H02N 2/106* (2013.01); *C04B 2235/3215* (2013.01); *B08B 7/026* (2013.01); *C04B 2235/3251* (2013.01); *H01L 41/43* (2013.01); *C04B 2235/605* (2013.01); *C04B 2235/5445* (2013.01); *C04B 2235/3258* (2013.01); *B41J 2/14233* (2013.01); *C04B 2235/6027* (2013.01); *H02N 2/163* (2013.01); *C04B 2235/3298* (2013.01); *C04B 35/495* (2013.01)
USPC .............. 310/358; 252/62.9 R; 252/62.9 PZ; 310/311

(56) References Cited

U.S. PATENT DOCUMENTS

| 2008/0067898 | A1  | 3/2008 | Aoki |             |
|--------------|-----|--------|------|-------------|
| 2010/0025618 | A1* | 2/2010 | Watanabe et al. | 252/62.9 R |
| 2013/0076204 | A1* | 3/2013 | Matsuda et al. | 310/311 |
| 2013/0088120 | A1* | 4/2013 | Hayashi et al. | 310/311 |

FOREIGN PATENT DOCUMENTS

| DE | 102006008742 A | 8/2007 |
| JP | 2000-169229 A | 6/2000 |
| JP | 2001-72466 A | 3/2001 |
| JP | 2002-293628 A | 10/2002 |
| JP | 2003-261379 A | 9/2003 |
| JP | 2006-182643 A | 7/2006 |
| JP | 2008-208004 A | 9/2008 |
| WO | 2010/125987 A1 | 11/2010 |
| WO | 2011/010566 A1 | 1/2011 |

OTHER PUBLICATIONS

U.S. Appl. No. 13/702,998, filed Dec. 7, 2012, Jumpei Hayashi.
Ferroelectric Properties of Tungsten Bronze Morphotropic Phase Boundary Systems, J. Am. Ceram. Soc. 72 202-11, 1989.
Japanese Journal of Applied Physics, 2008, vol. 47, No. 9, pp. 7693-7697.
Japanese Journal of Applied Physics, 2008, vol. 47, No. 5, pp. 4242-4247.
Takuro Ikeda et al., "Some Compounds of Tungsten-Bronze Type $A_6B_{10}O_{30}$ (B=Nb, Ti or Nb, W)", Japanese Journal of Applied Physics, Aug. 1971, pp. 987-994, vol. 10, No. 8.
Fang Liang et al., "Structural and Dielectric Properties of a Niobate $Ba_3NaBiNb_{10}O_{30}$", Wuli Huaxue Xuebao, May 30, 2001, pp. 457-459, vol. 17, No. 5, China Academic Journal Electronic Publishing House.
Neurgaonkar et al., "Growth and Ferroelectric Properties of Tungsten Bronze $Sr_{2-x}CaNb_5O_{15}$ Single Crystals", Materials Research Bulletin, Oct. 31, 1988, pp. 1459-1467, vol. 23, No. 10.

\* cited by examiner

PIEZOELECTRIC MATERIAL, PIEZOELECTRIC ELEMENT, LIQUID DISCHARGE HEAD, ULTRASONIC MOTOR, AND DUST CLEANING DEVICE

TECHNICAL FIELD

The present invention relates to piezoelectric materials. In particular, it relates to a lead-free piezoelectric material. It also relates to a piezoelectric element, a liquid discharge head, an ultrasonic motor, and a dust cleaning device that use the lead-free piezoelectric material.

BACKGROUND ART

Lead zirconate titanate that contains lead is a piezoelectric material most widely used in various piezoelectric devices. Attempts have been made to replace lead-containing piezoelectric materials by lead-free piezoelectric materials. This is to address the concern that lead-containing piezoelectric devices once discarded and exposed to acid rain may inflict damage on ecosystem as the lead component in the piezoelectric materials may leach into earth. Thus, various proposals of piezoelectric material have been made.

One example of the lead-free piezoelectric material is a tungsten bronze structure material containing, for example, barium bismuth niobate as a main component. PTL 1 discloses a material system that contains barium lithium niobate as a main component and bismuth niobate as an accessory component. However, since the unit cell of crystals having a tungsten bronze structure has a high shape anisotropy, the polar axis direction lies only in the c-axis direction, i.e., the short side direction. Accordingly, there have been fewer effective domains that can contribute to piezoelectricity and the piezoelectric properties have been unsatisfactory.

Another approach to enhancing the properties of a lead-free piezoelectric material having a tungsten bronze structure is to orient the piezoelectric material by using a magnetic field (magnetic orientation). Magnetic orientation can increase the number of effective magnetic domains that contribute to piezoelectricity. PTL 2 discloses a technique of using anisotropic particles as the starting material to improve the degree of orientation in conducting magnetic orientation. However, this technique is applicable only to piezoelectric materials that can use anisotropic particles as the starting material and the composition of the piezoelectric material to which this approach can be applied is limited.

The present invention provides a lead-free piezoelectric material containing a barium bismuth calcium niobate-based tungsten bronze structure metal oxide having a high degree of orientation. A piezoelectric element, a liquid discharge head, an ultrasonic motor, and a dust cleaning device that use the piezoelectric material are also provided.

CITATION LIST

Patent Literature

PTL 1 Japanese Patent Laid-Open No. 2001-72466
PTL 2 Japanese Patent Laid-Open No. 2008-208004

SUMMARY OF INVENTION

The invention provides a piezoelectric material that includes a tungsten bronze structure metal oxide that includes metal elements which are barium, bismuth, calcium, and niobium, and tungsten. The metal elements satisfy following conditions on a molar basis:

when Ba/Nb=a, $0.37 \leq a \leq 0.40$,
when Bi/Nb=b, $0.020 \leq b \leq 0.065$, and
when Ca/Nb=c, $0.007 \leq c \leq 0.10$. The tungsten content on a metal basis is 0.4 to 2.0 parts by weight relative to 100 parts by weight of the tungsten bronze structure metal oxide. The tungsten bronze structure metal oxide has a c-axis orientation.

The present invention also provides a piezoelectric element that includes a first electrode, a piezoelectric material, and a second electrode, a liquid discharge head that includes the piezoelectric element, an ultrasonic motor that includes the piezoelectric element, and a dust cleaning device that includes the piezoelectric element.

The present invention provides a piezoelectric material that contains a barium bismuth calcium niobate-based tungsten bronze structure metal oxide having a high degree of orientation. Since the piezoelectric material is lead-free, the impact on the ecosystem is low. A piezoelectric element, a liquid discharge head, an ultrasonic motor, and a dust cleaning device that have high durability can also be provided.

DESCRIPTION OF EMBODIMENTS

Embodiments of the present invention will now be described.

A piezoelectric material according to an embodiment includes a tungsten bronze structure metal oxide that contains metal elements, Ba, Bi, Ca, and Nb that satisfy conditions below on a molar basis, and tungsten (W):

when Ba/Nb=a, $0.37 \leq a \leq 0.40$,
when Bi/Nb=b, $0.020 \leq b \leq 0.065$, and
when Ca/Nb=c, $0.007 \leq c \leq 0.10$.

The tungsten (W) content on a metal basis is 0.4 to 2.0 parts by weight relative to 100 parts by weight of the tungsten bronze structure metal oxide. The tungsten bronze structure metal oxide has a c-axis orientation.

In the present invention, the term "tungsten bronze structure" refers to what is generally known as tetragonal tungsten bronze (TTB) structure, and not $H_xWO_3$ (tungsten bronze) or a hexagonal tungsten bronze (HTB) structure known for its electrochromic phenomena.

This piezoelectric material is a tungsten bronze structure metal oxide that at least contains Ba, Bi, Ca, and Nb. It is considered that Ba, Bi, and Ca occupy A sites and Nb occupies B sites. When a tungsten bronze structure is constituted by Ba, Bi, Ca, and Nb, a piezoelectric material having a high curie temperature, a high mechanical quality factor, and high piezoelectricity can be provided. That the piezoelectric material has a tungsten bronze structure can be confirmed by, for example, X-ray diffraction analysis. A diffraction pattern characteristic of a tungsten bronze structure measured in a 2θ-θ mode has a peak attributable to (001) plane near 2θ=22.5°, a peak attributable to (211) plane near 2θ=32.1°, and a peak attributable to (002) plane near 2θ=46.2°.

The phrase "on a molar basis" means that the amounts of the elements, such as Ba, Bi, Ca, and Nb, contained in the tungsten bronze structure determined by X-ray fluorescence analysis, inductively coupled plasma (ICP) atomic emission spectroscopy, atomic absorption spectrometry, or the like are converted to ratios in terms of moles. The ratio a of Ba to Nb on a molar basis is $0.37 \leq a \leq 0.40$. When the ratio a is less than 0.37, the curie temperature is lowered and the piezoelectric material may not function at room temperature. When the ratio a is greater than 0.40, the piezoelectric property is degraded.

The ratio b of Bi to Nb on a molar basis is $0.020 \leq b \leq 0.065$. When the ratio b is less than 0.020, the piezoelectric property is lowered. When the ratio b is greater than 0.065, the curie temperature is lowered and the piezoelectric material may not function at room temperature.

The ratio c of Ca to Nb on a molar basis is $0.007 \leq c \leq 0.10$. When the ratio c is less than 0.007, the curie temperature is lowered and the piezoelectric material may not function at room temperature. When the ratio c is greater than 0.10, abnormal grain growth occurs after sintering, and the piezoelectric material may lose mechanical strength. The term "abnormal grain growth" here means that the particle size is 200 μm or more. Such grains mixed with normal grains several micrometers in size deteriorate the mechanical strength.

The W content "on a metal basis" is determined by measuring the contents of metals, such as Ba, Bi, Ca, Nb, and W from the tungsten bronze structure metal oxide by X-ray fluorescence analysis, ICP atomic emission spectroscopy, atomic absorption spectrometry, or the like, converting the measured contents of the elements, such as Ba, Bi, Ca, and Nb, constituting the tungsten bronze structure into oxide-based values, and determining the ratio of the weight of tungsten (W) relative to the total of the converted metal contents.

Three axes that extend along the sides of the unit cell constituting a crystal are referred to as a-axis, b-axis, and c-axis. In general, a tungsten bronze structure has a cuboidal unit cell and the three axes intersect one another substantially perpendicularly. The length of each axis is referred to as "axis length". The c-axis length of the tungsten bronze structure is as short as about one third of the a-axis length or the b-axis length. In this specification, the term "(001) plane" refers to a plane to which the c-axis is normal.

In this specification, "orient" means that all or part of subject crystal faces are oriented in a particular direction. The "degree of orientation" indicates the degree at which the crystal faces are oriented. The degree of orientation increases when there are more portions where subject crystals faces are oriented in a particular direction. The term "c-axis orientation" means that crystal faces that lie in the c-axis direction are oriented, i.e., (001) planes are oriented. In other words, the "c-axis orientation" and the "(001) plane orientation" have the same meaning. The pole axis direction, which is the function-occurring axis of a tungsten bronze structure as a piezoelectric material, is the c-axis direction. The piezoelectric property of a tungsten bronze structure metal oxide is enhanced when c-axis orientation is achieved.

In general, a tungsten bronze structure metal oxide is expressed by a chemical formula, $A_{4-6}B_{10}O_{30}$. In the chemical formula, A indicates elements that occupy A sites. A1 sites (12-coordinated box-shaped sites when viewed in the c-axis direction) and A2 sites (15-coordinated pentagonal sites when viewed in the c-axis direction) are not distinguished. Ba and Bi primarily occupy one of two specific positions called A1 sites and A2 sites that exist around the oxygen octahedron. The maximum value of the sum of the numbers of A1 sites and A2 sites is 6.

In the chemical formula above, B indicates elements that occupy B sites. Pentavalent elements primarily occupy the B sites. In this invention, B is primarily Nb and exists inside the oxygen octahedron.

In the present invention, tungsten (W) sometimes occupies some of the B sites but this is not essential. The form in which W is contained may be an oxide, a metal, or a metal ion.

When W is contained in the piezoelectric material, the dielectric constant of the tungsten bronze structure metal oxide increases and the piezoelectric constant increases along with this. Incorporation of W also enhances the anisotropy of magnetic susceptibility and improves the degree of orientation when magnetic orientation is conducted. This is presumably due to the following reason. That is, when W replaces some of the Nb atoms in the B sites, the magnetic susceptibility or the magnetic moment in all directions of the unit cell undergo change. As a result, the anisotropy is enhanced by the difference in magnetic susceptibility among different directions of the unit cell. This phenomenon is presumably caused by the fact that the ionic radius (0.062 nm) of a hexavalent W ion is close to the ionic radius (0.069 nm) of Nb. In other words, incorporation of W brings two effects: improving the degree of orientation in magnetic-field processing and increasing the dielectric constant. As a result, the piezoelectric constant of the piezoelectric material of this embodiment increases significantly.

The W content on a metal basis is 0.4 to 2.0 parts by weight relative to 100 parts by weight of the tungsten bronze structure metal oxide. At a W content more than 2.0 parts by weight, the curie temperature may drop significantly. At a low curie temperature, the polarization process becomes difficult and the inherent piezoelectric properties of the piezoelectric material may not be fully exhibited. At a W content less than 0.4 parts by weight, the properties may not change much compared to when no W is contained. The W content can be 1.0 to 1.6 parts by weight.

The Lotgering factor F of the piezoelectric material may be 0.73 to 1.00. A Lotgering factor is an indicator of the degree of c-axis (or (001)) orientation of the tungsten bronze structure metal oxide determined by X-ray diffraction analysis.

Although there are several indicators of the degree of orientation, a Lotgering factor F is used in this specification to indicate the degree of orientation. A Lotgering factor F larger than 0 indicates that the subject crystal faces are oriented.

When the Lotgering factor F is less than 0.73, there are fewer effective domains that can contribute to piezoelectricity and the piezoelectric properties are not sufficient. As the Lotgering factor F approaches 1, more effective domains that can contribute to piezoelectricity are generated and thus the piezoelectric constant is increased. When the Lotgering factor F is 1, the only peak detected is the diffraction peak attributable to the subject crystal plane. In other words, all crystals detectable by X-ray diffraction analysis are aligned and oriented in the subject direction.

The Lotgering factor F is calculated by 2θ-θ X-ray diffraction analysis. It is calculated using equation 1 below by using the cumulative peak intensity I of X rays diffracted by the target crystal plane at 2θ in the range of 10° to 70°:

$$F = (\rho - \rho_0)/(1 - \rho_0) \quad \text{(equation 1)}$$

In equation 1, in the case of c-axis orientation, $\rho_0$ is determined by using the X-ray diffraction intensity ($I_0$) of a randomly oriented sample and calculated from equation (2) below as the ratio of the total of the diffraction intensities of the (001) plane (all faces perpendicular to the c-axis, l=1 or 2) to the total diffraction intensity:

$$\rho_0 = \Sigma I_0(001)/\Sigma I_0(hkl) \quad \text{(Equation 2)}$$

In equation 1, in case of the c-axis orientation, $\rho$ is determined by using the X-ray diffraction intensity (I) of an oriented sample and calculated from equation (3) below as the ratio of the total of the diffraction intensities of the (001) plane to the total diffraction intensity as with equation (2) above:

$$\rho = \Sigma I(001)/\Sigma I(hkl) \quad \text{(Equation 3)}$$

The piezoelectric material of this embodiment contains manganese (Mn) and the Mn content on a metal basis is 0.150 to 0.480 parts by weight relative to 100 parts by weight of the tungsten bronze structure metal oxide.

Since the piezoelectric material contains Mn, the mechanical quality factor Qm can be improved without degrading the Lotgering factor F. The Mn content is 0.16 to 0.48 parts by weight. When the Mn content is less than 0.16 parts by weight, the properties may not change much compared to when no Mn is contained. When the Mn content exceeds 0.48 parts by weight, the piezoelectric properties may deteriorate and other phases may occur. The Mn content may be 0.20 to 0.40 parts by weight. The mechanical quality factor Qm is a factor that indicates elastic loss caused by vibration when the piezoelectric material is evaluated as a vibrator. When the magnitude of the mechanical quality factor is electrically measured, the mechanical quality factor is observed as the sharpness of a resonance curve. In other words, the mechanical quality factor is a factor that indicates the sharpness of the resonance of a vibrator.

The region of the piezoelectric material in which Mn exists is not limited. Manganese may occupy the sites or lie in grain boundaries without occupying the sites. The form of incorporation of Mn may be any of metal, oxide, and metal ion. When Mn is incorporated in form of metal ion, the valence may be 2, 3, 4, or 6.

Sr and Mg may occupy the A sites of the tungsten bronze structure metal oxide and elements other than Nb may occupy the B sites of the tungsten bronze structure metal oxide to facilitate production of the piezoelectric material or adjust the physical properties of the piezoelectric material. Examples of elements to be contained in the B sites include not only pentavalent metal elements such as Ta and V but also trivalent and tetravalent metal elements, more specifically, Fe, Al, Ti, and Zr. The content of these elements to be contained in the B sites is preferably 20 mol % or less and more preferably 5 mol % or less of all B-site elements. The decrease in total valence of the B-site elements may be compensated by increasing the amount of the A site elements.

Elements such as Cu, Zn, and Co may be added to the piezoelectric material to facilitate production of the piezoelectric material and adjust the physical properties of the piezoelectric material. The amount of such additional element may be 5 parts by weight or less relative to 100 parts by weight of the tungsten bronze structure metal oxide. When more than 5 parts by weight of such elements are added, structures other than the tungsten bronze structure may occur and the insulating property may decrease.

The metal elements that occupy the respective sites of the piezoelectric material can be identified by, for example, a Rietveld method. According to the Rietveld method, not only the type of metal that occupies the sites but also the ratio thereof can be identified.

The method for preparing the piezoelectric material is not particularly limited. The piezoelectric material may be prepared by a common method of sintering a powder obtained by using raw materials, such as oxides, nitrates, and oxalates of the metals constituting the piezoelectric material or a molded body prepared by slip casting, the sintering being performed under a normal pressure. Examples of other techniques that can be employed include electric heating, microwave sintering, millimeter wave sintering, and hot isostatic pressing. From the viewpoint of suitability to magnetic-field orientation, a technique of sintering, under a normal pressure, a molded body formed by slip-casting a slurry may be employed.

The method for orienting the piezoelectric material is not limited to a particular method. For example, a grain orientation method using a doctor blade or a magnetic orientation method that uses a high magnetic field may be employed. A magnetic orientation method is preferred since a molded body having a c-axis orientation can be easily obtained. Magnetic orientation that uses a rotating magnetic field is more preferable.

The method for adding W, Mn, etc., to the tungsten bronze structure metal oxide is not particularly limited. For example, W may be added after the elements constituting the tungsten bronze structure metal oxide are mixed, calcined, and reacted. Alternatively, W may be mixed with the elements constituting the tungsten bronze structure metal oxide, and calcined and reacted simultaneously.

Figure 2:
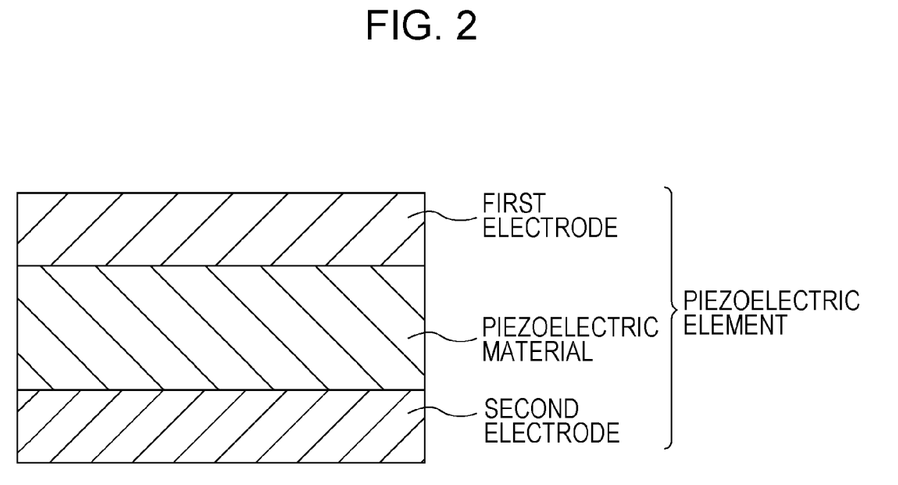
FIG. 2 is a schematic view of a piezoelectric element according to an embodiment.

FIG. 2 is a schematic view of a piezoelectric element according to an embodiment. The piezoelectric element of this embodiment includes a piezoelectric material, and a first electrode and a second electrode disposed on the piezoelectric material. The first and second electrodes may be disposed on one surface of the piezoelectric material or on opposing surfaces of the piezoelectric material so as to sandwich the piezoelectric material.

Figure 3A:
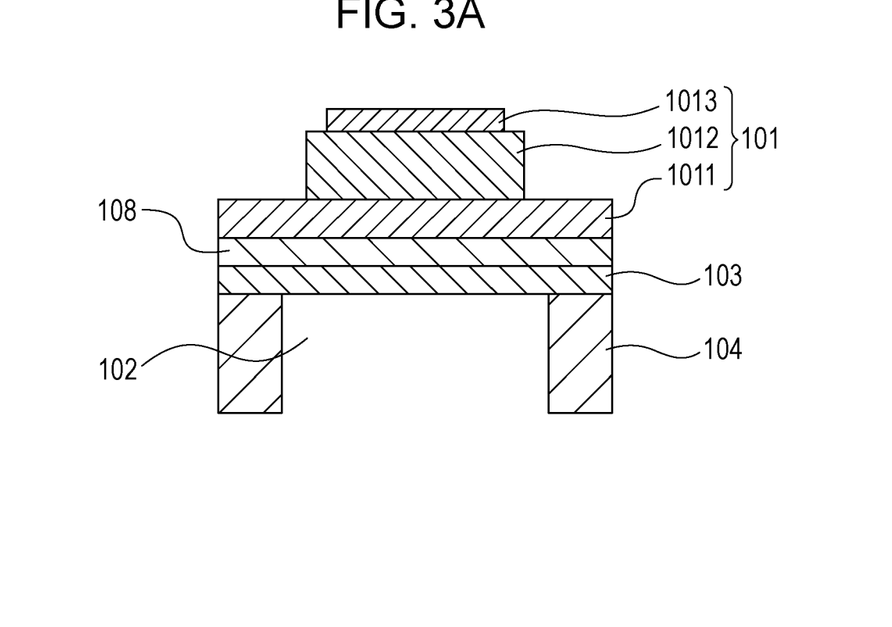
FIG. 3A and FIG. 3B are schematic diagrams showing one example of a liquid discharge head according to an embodiment.
Figure 3B:
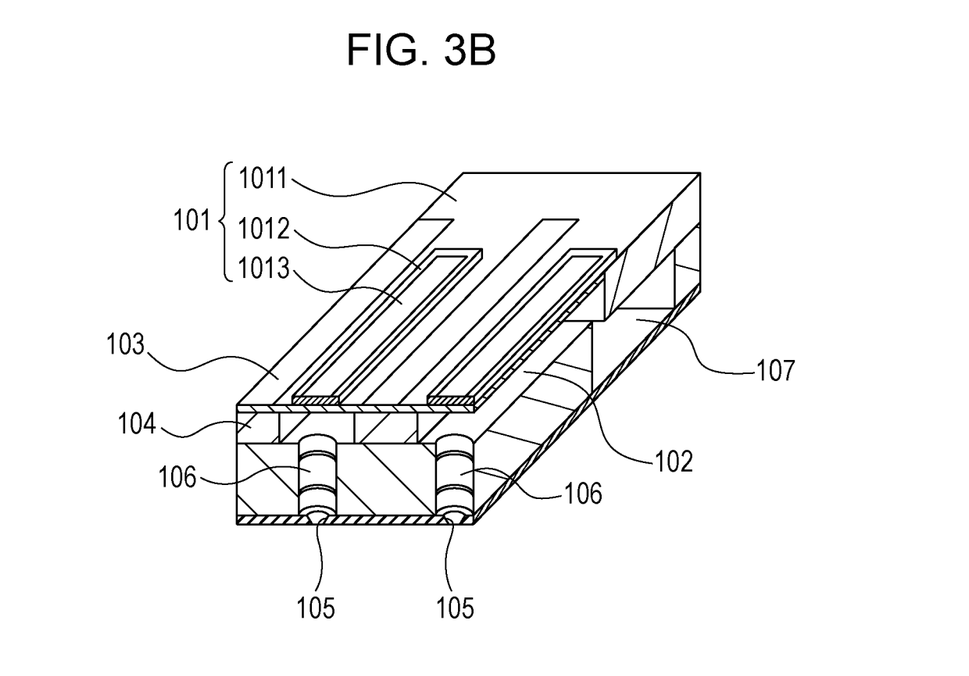

FIG. 3A and FIG. 3B are schematic diagrams showing one example of a liquid discharge head according to an embodiment of the present invention. The liquid discharge head includes a piezoelectric element 101. The piezoelectric element 101 includes a first electrode 1011, a piezoelectric material 1012, and a second electrode 1013. The piezoelectric material 1012 is patterned according to need as shown in FIG. 3B.

FIG. 3B is a schematic diagram of the liquid discharge head. The liquid discharge head includes discharge ports 105, individual liquid chambers 102, connecting holes 106 connecting the individual liquid chambers 102 to the discharge ports 105, liquid chamber walls 104, a common liquid chamber 107, a vibrating plate 103, and the piezoelectric element 101. Although the piezoelectric element 101 in the drawing has a rectangular shape, it may have any other shape, such as elliptical, circular, rectangular parallelepiped, etc. In general, the piezoelectric material 1012 has a shape corresponding to the shape of the individual liquid chambers 102.

The piezoelectric element 101 of the liquid discharge head and nearby parts will now be described in detail with reference to FIG. 3A. FIG. 3A is a cross-sectional view of the piezoelectric element taken in the width direction of the liquid discharge head shown in FIG. 3B. Although the cross-sectional shape of the piezoelectric device 101 is rectangular in this embodiment, the shape may be a trapezoidal or reversed trapezoidal shape.

In the drawing, the first electrode 1011 is used as a lower electrode and the second electrode 1013 is used as an upper electrode. However, arrangement of the first electrode 1011 and the second electrode 1013 is not limited to this. The first electrode 1011 may be used as a lower electrode or an upper electrode. The second electrode 1013 may be used as an upper electrode or a lower electrode. A buffer layer 108 may be interposed between the vibrating plate 103 and the lower electrode.

It should be noted here that these names of the components are determined depending on the process of producing the device and the advantageous effects of the present invention can be achieved in any case. According to this liquid discharge head, the vibrating plate 103 moves up and down by expansion and contraction of the piezoelectric material 1012 and pressure the liquid contained in the individual liquid chambers 102 so that the liquid is discharged from the discharge ports 105. The liquid discharge head can be used in printers and for electronic device production.

The thickness of the vibrating plate 103 is 1.0 μm or more and 15 μm or less and preferably 1.5 μm or more and 8 μm or less. The material for the vibrating plate 103 is not limited but may be silicon. Silicon constituting the vibrating plate may be doped with boron or phosphorus. The buffer layer and the electrode layer on the vibrating plate may form part of the vibrating plate.

The thickness of the buffer layer 108 is 5 nm or more and 300 nm or less and more preferably 10 nm or more and 200 nm or less. The size of the discharge ports 105 is 5 μm or more and 40 μm or less in terms of circular equivalent diameter. The shape of the discharge ports 105 may be circular but may be a star shape, a rectangular shape, or a triangular shape.

Figure 4A:
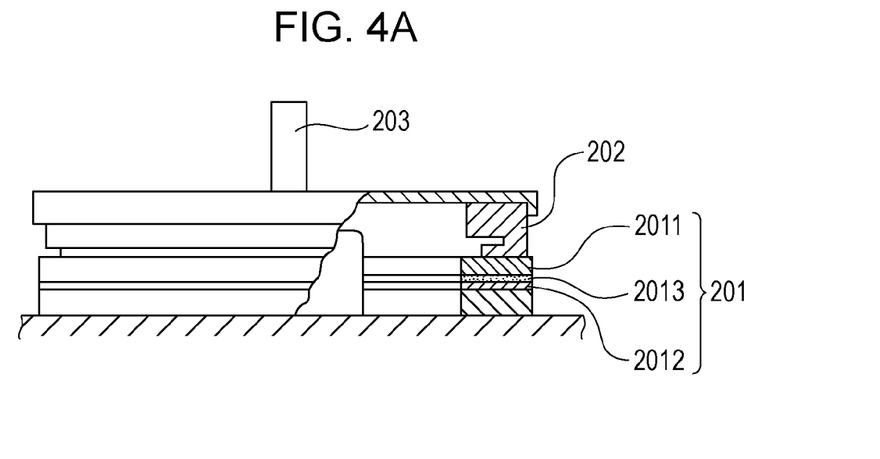
FIG. 4A is a schematic diagram showing an ultrasonic motor according to an embodiment.
Figure 4B:
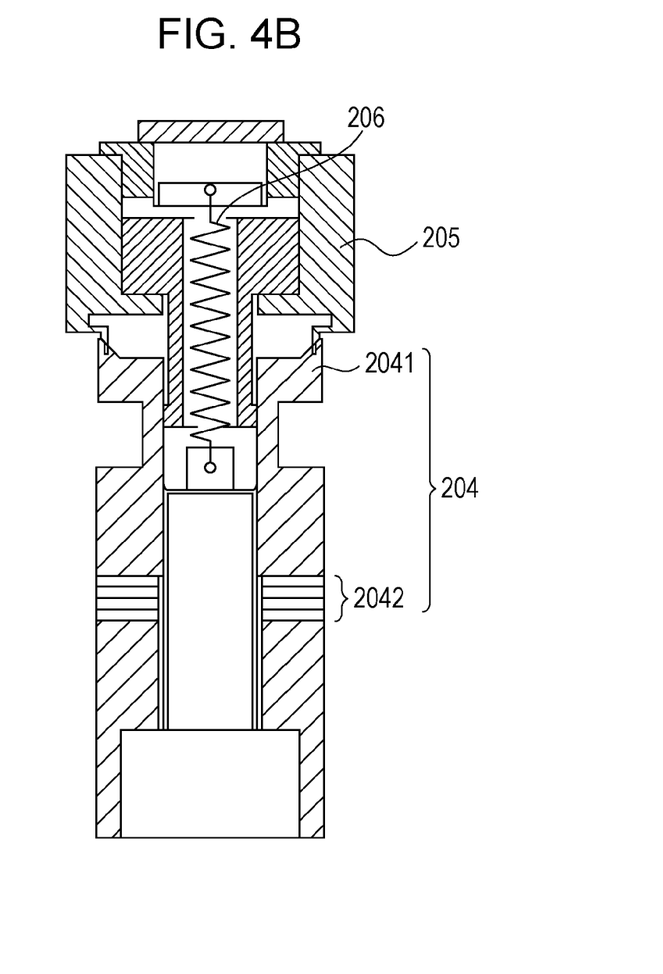
FIG. 4B is a schematic diagram showing an ultrasonic motor according to another embodiment.

Ultrasonic motors using the piezoelectric element will now be described. FIGS. 4A and 4B are schematic views showing examples of embodiments of ultrasonic motors. FIG. 4A shows an ultrasonic motor including a piezoelectric element constituted by a single plate. This ultrasonic motor includes a vibrator 201, a rotor 202 abutting the sliding surface of the vibrator 201 under pressure from a pressurizing spring not shown in the drawing, and an output shaft 203 integrally formed with the rotor 202. The vibrator 201 includes a metal elastic ring 2011, a piezoelectric element 2012, and an organic adhesive 2013 (epoxy- or cyanoacrylate-based adhesive, for example) that bonds the piezoelectric element 2012 to the metal elastic ring 2011. The piezoelectric element 2012 includes a first electrode, a second electrode, and a piezoelectric material interposed between the first and second electrodes (not shown).

When two-phase AC voltage (phase difference: $\pi/2$) is applied to the piezoelectric element, a bending travelling wave occurs in the vibrator 201, and individual points on the sliding surface of the vibrator 201 undergo elliptical motions. When the rotor 202 is pressure-contacted with the sliding surface of the vibrator 201, the rotor 202 receives friction force from the vibrator 201 and rotates in the direction opposite to the bending travelling wave. An object to be driven not shown in the drawing is joined to the output shaft 203 and is driven by the turning force of the rotor 202. When a voltage is applied to the piezoelectric material, the piezoelectric material expands and contracts by a transversal piezoelectric effect. When an elastic body, such as a metal, is in contact with the piezoelectric element, the elastic body is bent by the expansion and contraction of the piezoelectric material. The type of ultrasonic motor described here utilizes this principle.

FIG. 4B shows an example of an ultrasonic motor that includes a piezoelectric element having a multilayer structure. A vibrator 204 includes cylindrical metal elastic bodies 2041 and a multilayer piezoelectric element 2042 interposed between the cylindrical metal elastic bodies 2041. The multilayer piezoelectric element 2042 is an element that includes two or more layers of piezoelectric material not shown in the drawing and includes a first electrode and a second electrode on the outer surface of the multilayer structure and inner electrodes inside the multilayer structure. The cylindrical metal elastic bodies 2041 are joined with bolts to fix the multilayer piezoelectric element 2042 therebetween to make a vibrator 204.

When alternating current voltages having phases different from each other are applied to the multilayer piezoelectric element 2042, the vibrator 204 excites two vibrations orthogonal to each other. These two vibrations are combined to form circular vibrations for driving at the tip of the vibrator 204. Note that an annular groove is formed in the upper portion of the vibrator 204 to increase the displacement of the vibration for driving.

A rotor 205 pressure-contacts the vibrator 204 due to a spring 206 for pressurization and obtains frictional force for driving. The rotor 205 is rotatably supported by bearings.

Next, a dust cleaning device using a piezoelectric element according to an embodiment of the present invention is described.

Figure 5A:
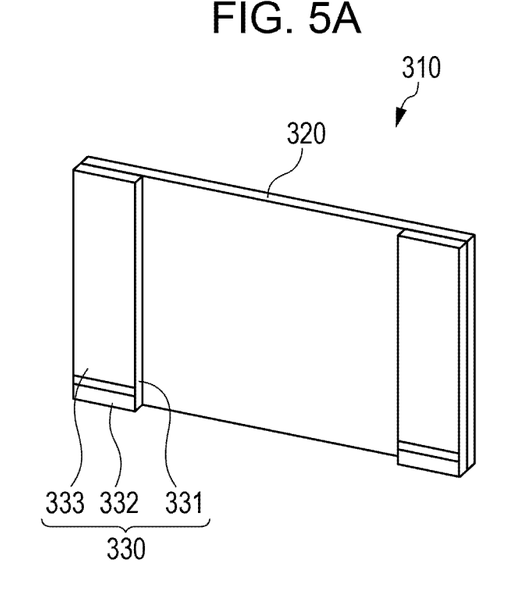
FIGS. 5A and 5B are schematic diagrams showing a dust cleaning device according to an embodiment.
Figure 5B:
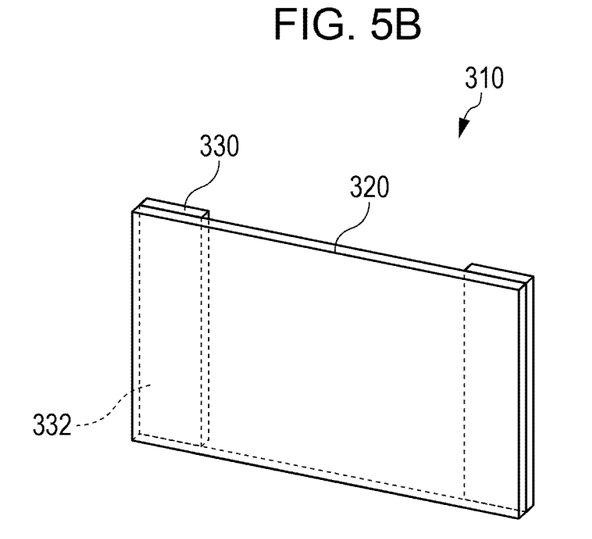

FIGS. 5A and 5B are schematic diagrams showing an embodiment of a dust cleaning device. A dust cleaning device 310 includes a plate-shaped piezoelectric element 330 and a vibrating plate 320. Although the material of the vibrating plate 320 is not limited, a transparent material or a light-reflecting material may be used in the vibrating plate 320 when the dust cleaning device 310 is to be used in optical devices.

As has been described heretofore, the piezoelectric element according to the present invention is suited for used in a liquid discharge head, an ultrasonic motor, etc. When the piezoelectric element is used in a liquid discharge head, a nozzle density and discharge force comparable or superior to that of a liquid discharge head that uses a lead-containing piezoelectric material can be achieved. When the lead-free piezoelectric material containing a tungsten bronze structure metal oxide is used in an ultrasonic motor, driving force and durability comparable or superior to that of an ultrasonic motor that uses a lead-containing piezoelectric material can be achieved. When the lead-free piezoelectric material containing a tungsten bronze structure metal oxide is used in a dust cleaning device, a dust cleaning efficiency comparable or superior to that of a dust cleaning device that uses a lead-containing piezoelectric material can be achieved. The piezoelectric material of the invention can be used not only in a liquid discharge head and a motor but also in other devices such as an ultrasonic vibrator, a piezoelectric actuator, a piezoelectric sensor, and a ferroelectric memory.

EXAMPLES

The piezoelectric material will now be described in specific detail through examples below. These examples do not limit the scope of the present invention.

Examples 1 to 7

A tungsten bronze structure metal oxide containing a particular amount of W was prepared. First, barium carbonate, calcium carbonate, bismuth oxide, and niobium oxide powders were used as the raw materials and dry-mixed in a mortar at a particular mixing ratio.

The mixture was placed in an alumina crucible and calcined by firing in an electric furnace at 950° C. for 5 hours in air. The mixture was then pulverized with a mortar. The pulverized mixture and a particular amount of tungsten oxide were placed in an alumina crucible and fired in an electric furnace at 1100° C. for 5 hours in air.

A slurry was prepared by mixing particular amounts of the calcined powder, pure water, and a dispersant and dispersing the resulting mixture with a pot mill.

Magnetic field processing was conducted using a superconducting magnetic (JMTD-10T180, produced by Japan Superconductor Technology, Inc.). A 10 T magnetic field was generated by the superconducting magnet, and a table was rotated at 30 rpm in a direction perpendicular to the direction of the magnetic field by using a nonmagnetic ultrasonic motor that can be rotated and driven in high magnetic fields. A plaster mold was placed on the table, and the slurry was poured into the plaster mold on the rotating table to conduct slip-cast molding and to obtain a disk-shaped body.

The disk-shaped body was subjected to main firing using an electric furnace at 1300° C. to 1350° C. for 6 hours in air. All sintered bodies obtained as a result were free of abnormal grain growth and had mechanical strength. The density of the sintered bodies was evaluated by an Archimedean method. After a surface of each sintered body was cut, structural analysis by X-ray diffraction analysis (XRD) and compositional analysis by X-ray fluorescence analysis were conducted.

Figure 1A:
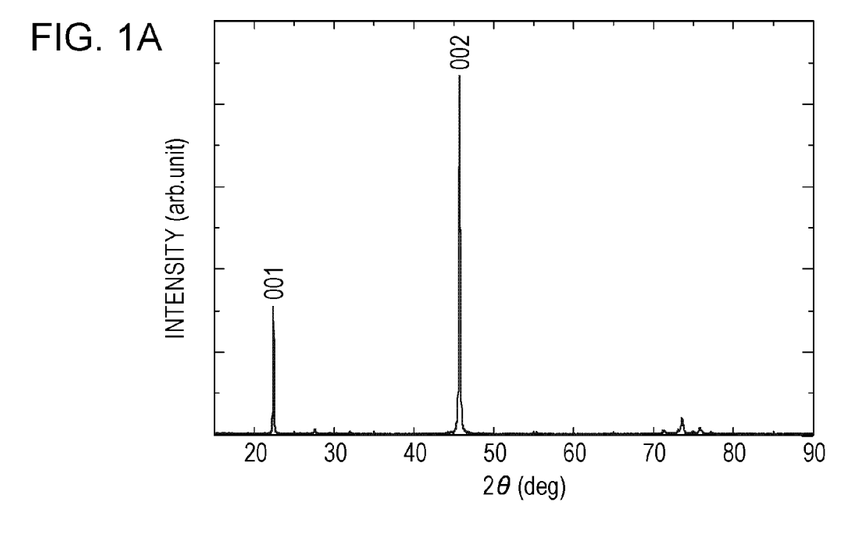
FIGS. 1A and 1B are diffraction patterns of piezoelectric materials taken by X-ray diffraction analysis in a 2θ-θ mode.
Figure 1B:
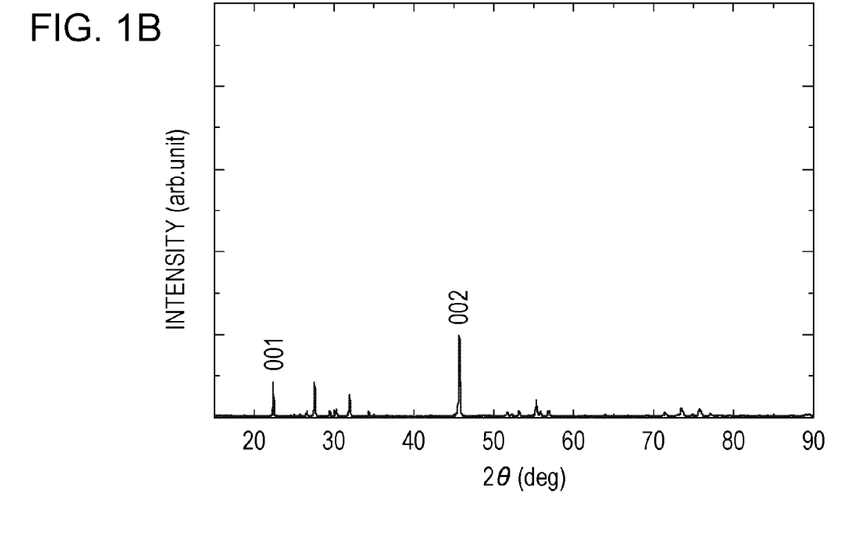

FIGS. 1A and 1B are diagrams observed by θ-2θ XRD. FIG. 1A is the XRD pattern of a piezoelectric material of Example 1 and FIG. 1B is the XRD pattern of a piezoelectric material of Comparative Example 1. The patterns show that both profiles are that of a tungsten bronze structure metal oxide. In Example 1, the intensity of the peak attributable to (001) is high, which indicates that c-axis orientation is achieved. The Lotgering factor F was calculated from the XRD results.

The results of the compositional analysis showed that the piezoelectric material was a tungsten bronze structure metal oxide represented by $(1-x) \cdot Ca_{1.4}Ba_{3.6}Nb_{10}O_{30}$-x·$Ba_4Bi_{0.67}Nb_{10}O_{30}$ ($0.30 \leq x \leq 0.95$). The disk-shaped sintered tungsten bronze structure metal oxide was polished to a thickness of 1 mm. Au electrodes 500 μm in thickness were formed on both surfaces of the oxide by using a sputtering machine. The resulting product was cut to 2.5 mm×10 mm by using a cutting machine and used as a piezoelectric element for evaluating electrical characteristics.

Polarizing was conducted by applying a voltage of 40 kV/cm for 20 minutes at 100° C. The state of polarization was confirmed by a resonance and anti-resonance method. The piezoelectric property was evaluated using a $d_{33}$ meter (PiezoMeter System produced by Piezotest).

Table 1 shows the composition, Lotgering factor F, and $d_{33}$ of the piezoelectric materials. In the table, a denotes the ratio Ba/Nb on a molar basis, b denotes the ratio Bi/Nb on a molar basis, and c denotes the ratio Ca/Nb on a molar basis. The Lotgering factor F indicates the degree of orientation of (001) plane. In Table 1, "W parts by weight" indicates the ratio of the weight of metallic tungsten to the total weight of the elements, such as Ba, Bi, Ca, and Nb, constituting the tungsten bronze structure on an oxide basis.

Comparative Examples 1 to 4

Samples of Comparative Examples 1 to 4 were prepared and evaluated in terms of electrical characteristics as in Examples 1 to 7. The magnetic-field processing was also conducted in the same manner. The composition, Lotgering factor F, and $d_{33}$ of the resulting piezoelectric materials are indicated in Table 1.

TABLE 1

| | Composition | | | W parts by weight | F | $d_{33}$ [pC/N] |
|---|---|---|---|---|---|---|
| | Ba/Nb = a | Bi/Nb = b | Ca/Nb = c | | | |
| Example 1 | 0.390 | 0.050 | 0.056 | 0.4 | 0.76 | 84 |
| Example 2 | 0.390 | 0.050 | 0.056 | 0.8 | 0.83 | 93 |
| Example 3 | 0.390 | 0.050 | 0.056 | 1.6 | 0.92 | 106 |
| Example 4 | 0.372 | 0.020 | 0.098 | 1.6 | 0.73 | 82 |
| Example 5 | 0.378 | 0.030 | 0.077 | 1.6 | 0.81 | 91 |
| Example 6 | 0.396 | 0.060 | 0.014 | 1.6 | 0.90 | 101 |
| Example 7 | 0.398 | 0.065 | 0.007 | 1.6 | 0.82 | 94 |
| Comparative Example 1 | 0.390 | 0.050 | 0.056 | 0 | 0.66 | 75 |
| Comparative Example 2 | 0.390 | 0.050 | 0.056 | 0.3 | 0.67 | 75 |
| Comparative Example 3 | 0.360 | 0.000 | 0.140 | 1.6 | 0.60 | 67 |
| Comparative Example 4 | 0.400 | 0.067 | 0.000 | 1.6 | 0.68 | 72 |

Table 1 shows that Examples 1 to 7 exhibited a high degree of orientation and a high piezoelectric constant compared to Comparative Examples 1 and 2. Comparison between Examples 1 to 7 and Comparative Examples 1 and 2 shows that when tungsten is not contained or contained only in small amounts, the susceptibility to a magnetic field is low and effects of improving the Lotgering factor F and $d_{33}$ cannot be expected. In a sample having a W content of 3.0 parts by weight, the curie temperature dropped significantly, i.e., to 80° C., and the polarization treatment was difficult. The piezoelectric constant $d_{33}$ was unsatisfactory, i.e., 20 pC/N. This suggests that the W content may be 0.40 to 2.00 parts by weight.

Comparative Examples 3 that does not contain Bi and Comparative Example 4 that does not contain Ca did not have Lotgering factors F improved by the magnetic-field processing despite incorporation of a sufficient amount of tungsten.

Examples 8 to 10

Piezoelectric materials described below differ from the piezoelectric materials of previous examples in that manganese (Mn) is further added.

A piezoelectric material composed of a tungsten bronze structure metal oxide represented by (1−x)CBN-xBBN ($0 \leq x \leq 1$), x=0.75 and containing a particular amount of W was prepared. First, barium carbonate, calcium carbonate, bismuth oxide, niobium oxide, and manganese oxide powders were used as the raw materials and dry-mixed in a mortar at a particular mixing ratio.

The mixture was placed in an alumina crucible and calcined by firing in an electric furnace at 950° C. for 5 hours in air. The mixture was then pulverized with a mortar. The pulverized mixture and a particular amount of tungsten oxide were placed in an alumina crucible and fired in an electric furnace at 1100° C. for 5 hours in air.

A slurry was prepared by mixing particular amounts of the calcined powder, pure water, and a dispersant and dispersing the resulting mixture with a pot mill.

Magnetic field processing was conducted using a superconducting magnetic (JMTD-10T180, produced by Japan Superconductor Technology, Inc.). A 10 T magnetic field was generated by the superconducting magnet, and a table was rotated at 30 rpm in a direction perpendicular to the direction of the magnetic field by using a nonmagnetic ultrasonic motor that can be rotated and driven in high magnetic fields. A plaster mold was placed on the table, and the slurry was poured into the plaster mold on the rotating table to conduct slip-cast molding and to obtain a disk-shaped body.

The disk-shaped body was subjected to main firing using an electric furnace at 1300° C. to 1350° C. for 6 hours in air. All sintered bodies obtained as a result were free of abnormal grain growth and had mechanical strength. The density of the sintered bodies was evaluated by an Archimedean method. After a surface of each sintered body was cut, structural analysis by X-ray diffraction analysis (XRD) and compositional analysis by X-ray fluorescence analysis were conducted.

The results of XRD showed that the obtained sintered bodies were composed of a tungsten bronze structure metal oxide. For samples of Examples 8 to 10 subjected to the magnetic-field processing, the intensity of the peak attributable to (001) is high, which indicates that c-axis orientation is achieved. The Lotgering factor F was calculated from the XRD results.

The results of the compositional analysis showed that the piezoelectric material was a tungsten bronze structure metal oxide represented by $(1-x) \cdot Ca_{1.4}Ba_{3.6}Nb_{10}O_{30}-x \cdot Ba_4Bi_{0.67}Nb_{10}O_{30}$ ($0.30 \leq x \leq 0.95$).

The disk-shaped sintered tungsten bronze structure metal oxide was polished to a thickness of 1 mm. Au electrodes 500 μm in thickness were formed on both surfaces of the oxide by using a sputtering machine. The resulting product was cut to 2.5 mm×10 mm by using a cutting machine and used as a piezoelectric element for evaluating electrical characteristics.

Polarizing was conducted by applying a voltage of 40 kV/cm for 20 minutes at 100° C. The state of polarization was confirmed by a resonance and anti-resonance method. The piezoelectric property was evaluated using a $d_{33}$ meter (PiezoMeter System produced by Piezotest).

Table 2 shows the composition, Lotgering factor F, $d_{33}$, and Qm of the piezoelectric material. In the table, a denotes the ratio Ba/Nb on a molar basis, b denotes the ratio Bi/Nb on a molar basis, and c denotes the ratio Ca/Nb on a molar basis. The Lotgering factor F indicates the degree of orientation of (001) plane. In Table 2, "W parts by weight" indicates the ratio of the weight of metallic tungsten to the total weight of the elements, such as Ba, Bi, Ca, and Nb, constituting the tungsten bronze structure on an oxide basis; and "Mn parts by weight" indicates the ratio of the weight of metallic manganese to the total weight of the elements, such as Ba, Bi, Ca, and Nb, constituting the tungsten bronze structure metal oxide on an oxide basis.

Comparative Examples 5 to 7

Samples of Comparative Examples 5 to 7 were prepared and evaluated in terms of electrical characteristics as in Examples 8 to 10. The composition, Lotgering factor F, $d_{33}$, and Qm of the resulting piezoelectric materials are indicated in Table 2.

Table 2 shows that samples of the Examples 8 to 10 exhibited a high degree of orientation and a high piezoelectric constant compared to samples of Comparative Examples 5 to 7.

The mechanical quality factor Qm of the samples of Examples 8 to 10 is 1800 or higher. In contrast, the mechanical quality factor Qm of Example 3 that has the same composition as Examples 8 to 10 but without manganese was 1513. Regarding Comparative Examples, the mechanical quality factor Qm of Comparative Example 6 is 732 and that of Comparative Example 3 that has the same composition but without manganese was 521. Similarly, whereas the mechanical quality factors Qm of Comparative Examples 5 and 7 are 1748 and 2110, respectively, the mechanical quality factors Qm of corresponding Mn-free Comparative Examples 1 and 4 were 1456 and 1854, respectively. This result shows that the material system that contains Mn exhibit a better mechanical quality factor Qm than the material system that contains no Mn.

Example 11

A piezoelectric material composed of a tungsten bronze structure metal oxide represented by $(1-x)CBN-xBBN$ ($0 \leq x \leq 1$), $x=0.75$ was prepared. CBN denotes $Ca_{1.4}Ba_{3.6}Nb_{10}O_{30}$ and BBN denotes $Ba_4Bi_{0.67}Nb_{10}O_{30}$. Barium carbonate, calcium carbonate, bismuth oxide, and niobium oxide powders were used as the raw materials and dry-mixed in a mortar at a particular mixing ratio.

In addition, another piezoelectric material composed of a tungsten bronze structure metal oxide containing Mn and represented by $(1-x)CBN-xBBN$ ($0 \leq x \leq 1$), $x=0.75$ was prepared. Manganese oxide, barium carbonate, calcium carbonate, bismuth oxide, and niobium oxide powders were used as the raw materials and dry-mixed in a mortar at a particular mixing ratio. The amount of the manganese oxide is preferably 0.1 to 10 parts by weight and more preferably 0.3 to 5 parts by weight on a metallic manganese basis.

Each of the two compositions was calcined in the same manner.

That is, the mixture was placed in an alumina crucible and calcined by firing in an electric furnace at 950° C. for 5 hours in air. The mixture was then pulverized with a mortar. The pulverized mixture was again placed in an alumina crucible and fired in an electric furnace at 1100° C. for 5 hours in air.

Two slurries were then respectively prepared from the two calcined powders in the same manner.

That is, the calcined powder obtained as above, pure water, and a dispersant were mixed at a particular ratio in a pot mill and dispersed for 24 hours. The state of dispersion was con-

TABLE 2

| | Composition | | | | | | | |
|---|---|---|---|---|---|---|---|---|
| | Ba/ Nb = a | Bi/ Nb = b | Ca/ Nb = c | W parts by weight | Mn parts by weight | F | $d_{33}$ [pC/N] | Qm [—] |
| Example 8 | 0.390 | 0.050 | 0.056 | 1.60 | 0.16 | 0.93 | 104 | 1821 |
| Example 9 | 0.390 | 0.050 | 0.056 | 1.60 | 0.32 | 0.94 | 102 | 2013 |
| Example 10 | 0.390 | 0.050 | 0.056 | 1.60 | 0.48 | 0.95 | 93 | 2242 |
| Comparative Example 5 | 0.390 | 0.050 | 0.056 | 0.00 | 0.16 | 0.69 | 68 | 1748 |
| Comparative Example 6 | 0.360 | 0.000 | 0.140 | 0.00 | 0.32 | 0.62 | 54 | 732 |
| Comparative Example 7 | 0.400 | 0.067 | 0.000 | 0.00 | 0.48 | 0.71 | 65 | 2110 | firmed by measuring the particle diameter with a dynamic light scattering photometer (ZetaSizer produced by Sysmex Corporation). The particle diameter was 950 nm in both slurries. The particle diameter may be 100 nm or more and 2 μm or less.

Magnetic field processing was conducted using a superconducting magnetic (JMTD-10T180, produced by Japan Superconductor Technology, Inc.). A 10 T magnetic field was generated by the superconducting magnet, and a table was rotated at 30 rpm in a direction perpendicular to the direction of the magnetic field by using a nonmagnetic ultrasonic motor that can be rotated and driven in magnetic fields.

A plaster mold serving as a base was placed on the table of the magnetic equipment, and a small amount of the slurry containing Mn was poured into the plaster mold on the rotating table and solidified to a particular degree so as to form an underlayer for slip casting.

The Mn-free second slurry was then poured into the plaster mold containing the underlayer to conduct slip-cast molding.

After the slip casting molding under the same conditions as in Example 1, the slurries were dried in the plaster mold overnight and the resulting dried body was removed from the plaster mold. The dried body was heated in an airtight container at 45° C. for 24 hours and then dried in air for 1 week.

The dried body was cut with a blade saw under the same conditions as Example 1 to remove the surface and the underlayer. As a result, a disk-shaped body was obtained.

The disk-shaped body was subjected to main firing using an electric furnace at 1300° C. to 1350° C. for 6 hours in air under the same conditions as Example 1. The density of each sintered body obtained thereby was evaluated by an Archimedean method. After a surface of each sintered body was cut, structural analysis by X-ray diffraction analysis (XRD) and compositional analysis by X-ray fluorescence analysis were conducted.

The structural analysis and compositional analysis found that the obtained piezoelectric material was a tungsten bronze structure metal oxide represented by $(1-x) \cdot Ca_{1.4}Ba_{3.6}Nb_{10}O_{30}$-$x \cdot Ba_4Bi_{0.67}Nb_{10}O_{30}$ ($0.30 \leq x \leq 0.95$).

The composition, Lotgering factor F, and $d_{33}$ of the obtained piezoelectric material are shown in Table 3.

As in Example 1, the disk-shaped sintered tungsten bronze structure metal oxide was polished to a thickness of 1 mm. Au electrodes 500 μm in thickness were formed on both surfaces of the oxide by using a sputtering machine. The resulting product was cut to 2.5 mm×10 mm by using a cutting machine and used as a piezoelectric element for evaluating electrical characteristics.

Polarizing was conducted by applying a voltage of 20 kV/cm for 10 minutes at 160° C. The state of polarization was confirmed by a resonance and anti-resonance method. The piezoelectric property was evaluated using a $d_{33}$ meter (PiezoMeter System produced by Piezotest).

Table 3 shows the composition, Lotgering factor F, and $d_{33}$ of the oriented tungsten bronze structure metal oxide. In the table, a denotes the ratio Ba/Nb on a molar basis, b denotes the ratio Bi/Nb on a molar basis, and c denotes the ratio Ca/Nb on a molar basis. The Lotgering factor F indicates the degree of orientation of (001) plane. The phrase, "W parts by weight" indicates the ratio of the weight of metallic tungsten to the total weight of the elements, such as Ba, Bi, Ca, and Nb, constituting the tungsten bronze structure on an oxide basis.

TABLE 3

| | Composition | | | W parts by weight | F | $d_{33}$ [pC/N] |
|---|---|---|---|---|---|---|
| | Ba/Nb = a | Bi/Nb = b | Ca/Nb = c | | | |
| Example 11 | 0.390 | 0.050 | 0.056 | 1.60 | 0.96 | 137 |

Table 3 shows that Example 11 exhibits a high degree of orientation and a high piezoelectric constant. Liquid discharge heads, ultrasonic motor, and dust cleaning device using piezoelectric material of Example 11

A liquid discharge head shown in FIGS. 3A and 3B, ultrasonic motors shown in FIGS. 4A and 4B, and a dust cleaning device shown in FIGS. 5A and 5B were fabricated using the piezoelectric material of Example 11. It was confirmed that ink was discharged from the liquid discharge head according to an input electrical signal and that the ultrasonic motors were rotated by application of alternating voltage. A good dust cleaning rate was observed when plastic beads were spread onto the surface of the dust cleaning device by application of alternating voltage.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-133292, filed Jun. 10, 2010, and No. 2011-115838, filed May 24, 2011, which are hereby incorporated by reference herein in their entirety.

Industrial Applicability

The present invention provides a piezoelectric material containing no components harmful to environment and having high piezoelectricity. The present invention also provides a piezoelectric element, a liquid discharge head, an ultrasonic motor, and a dust cleaning device that use the piezoelectric material.

| Reference Signs List | |
|---|---|
| 101 | piezoelectric element |
| 102 | individual liquid chamber |
| 103 | vibrating plate |
| 104 | liquid chamber wall |
| 105 | discharge port |
| 106 | connecting hole |
| 107 | common liquid chamber |
| 108 | buffer layer |
| 1011 | first electrode |
| 1012 | piezoelectric material |
| 1013 | second electrode |
| 201 | vibrator |
| 202 | rotor |
| 203 | output shaft |
| 204 | vibrator |
| 205 | rotor |
| 206 | spring |
| 2011 | elastic ring |
| 2012 | piezoelectric element |
| 2013 | organic adhesive |
| 2041 | metal elastic body |
| 2042 | multilayer piezoelectric element |
| 310 | dust cleaning device |
| 330 | piezoelectric element |
| 320 | vibrating plate |

The invention claimed is:

1. A piezoelectric material comprising:
   a tungsten bronze structure metal oxide that includes metal elements which are barium, bismuth, calcium, and niobium; and
   tungsten,
   wherein
   the metal elements satisfy following conditions on a molar basis:
   when Ba/Nb=a, $0.37 \leq a \leq 0.40$,
   when Bi/Nb=b, $0.020 \leq b \leq 0.065$, and
   when Ca/Nb=c, $0.007 \leq c \leq 0.10$;
   a tungsten content on a metal basis is 0.4 to 2.0 parts by weight relative to 100 parts by weight of the tungsten bronze structure metal oxide; and
   the tungsten bronze structure metal oxide has a c-axis orientation.

2. The piezoelectric material according to claim 1, wherein the piezoelectric material has a Lotgering factor F of 0.73 or more and 1.00 or less, where the Lotgering factor F indicates the degree of c-axis orientation determined by X-ray diffraction analysis.

3. The piezoelectric material according to claim 1, wherein the tungsten bronze structure metal oxide is represented by $(1-x).Ca_{1.4}Ba_{3.6}Nb_{10}O_{30}\text{-}x.Ba_4Bi_{0.67}Nb_{10}O_{30}$ ($0.30 \leq x \leq 0.95$).

4. The piezoelectric material according to claim 1, wherein the piezoelectric material further comprises manganese, and a manganese content on a metal basis is 0.16 to 0.48 parts by weight relative to 100 parts by weight of the tungsten bronze structure metal oxide.

5. A piezoelectric element comprising:
   a first electrode;
   a piezoelectric material; and
   a second electrode,
   wherein the piezoelectric material is the piezoelectric material according to claim 1.

6. A liquid discharge head comprising:
   the piezoelectric element according to claim 5.

7. An ultrasonic motor comprising:
   the piezoelectric element according to claim 5.

8. A dust cleaning device comprising:
   the piezoelectric element according to claim 5.

* * * * *